METAL-OXIDE-SEMICONDUCTOR CAPACITOR USING GENETIC SEMICONDUCTOR COMPOUND AS DIELECTRIC

Filed Jan. 5, 1966

INVENTOR.
JACQUES THIRE
BY
Frank R. [signature]
AGENT

United States Patent Office 3,402,332

Patented Sept. 17, 1968

3,402,332

METAL-OXIDE-SEMICONDUCTOR CAPACITOR USING GENETIC SEMICONDUCTOR COMPOUND AS DIELECTRIC

Jacques Thire, Calvados, France, assignor to North American Philips Company, Inc., New York, N.Y., a corporation of Delaware Filed Jan. 5, 1966, Ser. No. 518,928
Claims priority, application France, Jan. 5, 1965, 904
5 Claims. (Cl. 317—240)

ABSTRACT OF THE DISCLOSURE

A metal-oxide-semiconductor capacitor in a semi-conductor wafer. A first capacitor electrode is a highly-doped layer in the wafer. The dielectric is a genetic oxide layer formed from a lower-doped layer in the wafer. The second electrode is a vapor-deposited metal on the dielectric. A connection to the first electrode is made through a hole in the dielectric. The highly-doped layer is made by in-diffusion, and the lower-doped layer is made by oxide-gettering. The process is compatible with the planar technology.

In manufacturing miniature capacitors for integrated circuits problems have been encountered, which have not been solved satisfactorily. It is known to manufacture miniature capacitors in circuits which comprise wafers carrying discrete transistors, resistors, inductors and capacitors, several wafers being mounted on a ceramic body within an envelope.

It is also known to manufacture miniature capacitors on semiconductor wafers in which for each capacitor one electrode is constituted by the semiconductor wafer itself, the dielectric by a layer of the oxide of the semiconductor and the second electrode by a layer of metal which generally is produced by evaporation, and such capacitors will hereinafter be referred to as metal-oxide-semiconductor (MOS) capacitors.

For manufacturing such a capacitor generally a wafer of silicon having a resistivity of about 0.01 Ωcm. is chosen This choice is based on a compromise. If the resistance of the wafer is high, the low conductivity of the electrode it constitutes involves a high loss factor; on the other hand, the oxidation of high-resistivity silicon yields an oxide including few impurities, which provides the advantage of a high quality of said oxide but gives rise to a strong varactor effect, that is to say a large variation of capacitance with voltage at the Si-$SiO_2$ interface. If, however, the resistivity of the wafer is low, the high impurity concentration of the silicon results in a poor quality of the $SiO_2$-layer and high leakage currents.

Since the most suitable value of the resistivity of the material used is chosen comparatively high in order to maintain the series resistance of the capacitor at a low value, the electric connection to the electrode constituted by the semiconductor wafer is generally established through a metal layer applied to the rear surface of the wafer, for example, by evaporation. This arrangement, however, is not very suitable for incorporating such capacitors in integrated circuits.

The technique most frequently used in manufacturing such integrated circuits consists in providing all active components and all passive components of the relevant circuit on a single semiconductor body comprising several differently doped layers. By insulating separating strips this body is divided into partitions, which may additionally be separated from one another by the provision of a junction which is biassed in the reverse direction. In such a structure all the connections and interconnections are established at the same side of the wafer. Hence, the known microminiature capacitors of the above-described type cannot be incorporated in integrated circuits since this would require one connection to be made to the front and the other to the rear of the wafer.

The present invention relates to a capacitor of a structure enabling it to be included in an integrated circuit.

The first electrode of this capacitor consists of a layer of very low resistivity and small thickness provided on a semiconductor body. The insulation consists of a genetic oxide layer consisting of the oxide of the same semiconductor material as the body but weakly doped. The second electrode is constituted by a thin layer of metal. The term "genetic oxide layer" as used herein is to be understood to mean a layer produced from the material of the substrate by oxidation of this material. The shapes of the two electrodes and of the insulating layer which together form this capacitance are such that a certain portion of the first electrode is not covered by the two other elements, that is to say by the insulating layer and the second electrode, so that to this electrode a contact can be made which is disposed on the same surface of the body as the contact to the second electrode.

Preferably the first electrode is made of a layer of very low resistivity, since the capacitor current passes through this electrode in the longitudinal direction.

The essential advantage of such a structure consists in that it can be incorporated in an integrated circuit and can be manufactured by methods compatible with so-called "planar" techniques.

Such a structure can be obtained in a variety of manners. For example, there may be epitaxially deposited on a silicon substrate a first layer of high conductivity and subsequently there may be epitaxially deposited on this layer a second layer of low conductivity, which is thermally oxidized, a window being made in the oxide layer by etching, after which the capacitor is completed in that a second electrode, the area of which is accurately defined by the use of a suitable mask, is provided by evaporation. Preferably, however, this structure is made by starting from a silicon wafer by using in accordance with the invention the method which will be described hereinafter and which is compatible with "planar" techniques.

This method consists in that in a silicon wafer a first electrode is produced by diffusion of an impurity to a small depth but at a high concentration, after which the concentration of this impurity at the surface is reduced by utilizing the property of silicon oxide of absorbing certain impurities, which property is referred to as "getter" effect, whereupon the surface layer which is thus purified is converted into silicon oxide which acts as the dielectric, and finally a second electrode is provided on the surface of this dielectric, for example, by evaporation.

In order that the invention may readily be carried into effect, an embodiment thereof will now be described, by way of example, with reference to the accompanying diagrammatic drawings, in which—

FIGURE 1 is a sectional view of the proposed structure, of which

FIGURE 3 shows the semiconductor wafer after the diffusion of the conductive layer intended to form a first electrode, FIGURE 3*a* being a graph showing the distribution of the impurities in this layer;

FIGURE 4 shows the wafer after the provision of an oxide layer which serves as a "getter," FIGURE 4*a* being a graph showing the distribution of the impurities in the doped layers.

FIGURE 5 shows the wafer after removal of the oxide layer after its gettering action.

FIGURE 6 shows the wafer after the provision of a fresh oxide layer to act as an insulator, and FIGURE 7 shows the window which is made in this layer and in which the contact to the semiconductor electrode is to be made.

Figure 1:
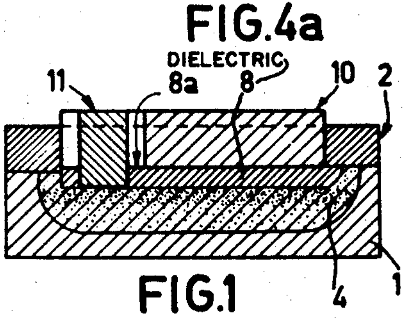

FIGURE 1 is a sectional view of a portion of a structure in accordance with the invention which is included in an integrated circuit, which may consist of silicon and the remaining part of which is not shown in the figure. The figure shows a part 1 of a semiconductor wafer, consisting of the bulk material, a heavily doped semiconductor layer 4 which serves as one of the electrodes, an insulating layer 8, a metal electrode 10, a metal contact 11 to the electrode 4, which electrode is insulated from the metal electrode 10 by a portion *8a* of the layer 8, which portion annularly surrounds the contact 11. An oxide layer 2 protects the surface of the semiconductor body.

Figure 2:
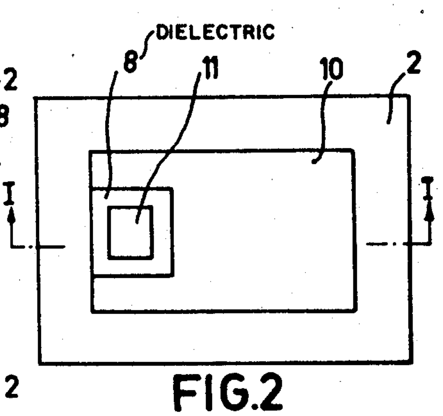
FIGURE 2 is a plan view.

FIGURE 2 is a plan view of the same device of which FIGURE 1 is a sectional view taken along the line I–I.

Owing to this structure in which both contacts are situated on the same face, this capacitance can be included in an integrated circuit. As is known, the bulk resistivity of a silicon wafer to be included in an integrated circuit always is comparatively high, i.e. of the order of 0.5 Ωcm. This high resistivity prevents the use of the undoped semiconductor body as an electrode, since it gives rise to excessive losses.

The wafer used hitherto as starting material for the known MOS capacitors has a resistivity of the order of 0.01 Ωcm., however, this value would be too high for use in a capacitor having contacts to one surface only of a semiconductor body. In these two cases the paths taken by the current are completely different. In the known capacitors, the contact to the semiconductor electrode is made by a metal layer applied to the entire lower surface of this electrode so that the current in the semiconductor flows along paths of short length equal to the thickness of the wafer, i.e. of the order of from 20 to 100 microns. In the capacitors in accordance with the invention, the paths of the current in the semiconductor are appreciably longer. Hence, it is important to have a layer 4 of very low resistivity which acts as a current conductor, whereas the resistivity of the portion 1 of the semiconductor body may be chosen arbitrarily.

Figure 3:
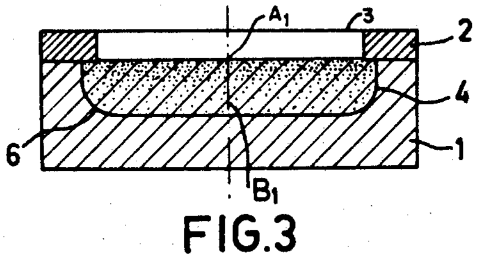
FIGURES 3 to 7 are diagrammatic sectional views of the capacitor in accordance with the invention at various stages of the manufacture.
Figure 3A:
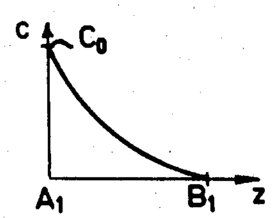

Consequently, the conductive layer 4 must have a resistivity at least of the order of 0.001 Ωcm. The layer 4 is formed by diffusion. Preferred impurities for this purpose are phosphorus for n-type silicon or boron for p-type silicon, which impurities usually are also employed in other parts of the circuit. A further reason of this choice will be given hereinafter. FIGURE 3 shows the layer 4 in the wafer 1, the varying density of the dots indicating the variation in impurity concentration. FIGURE *3a* is a curve showing the impurity distribution as a function of the depth $z$ between $A_1$ and $B_1$, $A_1$ being a point on the surface of the wafer and $B_1$ a point on the perpendicular to this surface at the level of the interface between the doped layer 4 and the undoped layer 1 of the wafer. The distance $A_1$–$B_1$ corresponds to the diffusion depth.

Depending on the diffusion method chosen, the curve of FIGURE *3a* descends exponentially with the square of the depth or according to a slightly different law. The surface region of the wafer which is to be converted to the oxide to form the dielectric of the capacitor has too high an impurity concentration.

It is known to remove impurities from surface layers of semiconductor bodies, subsequent to doping, by outdiffusion techniques. These consist in heating the wafer in a vacuum, if it is desired to form a surface layer which is substantially free from impurities, or in heating it in the presence of an absorbant or a "getter," if it is desired to form a surface layer which is partly free from impurities. In order also to avoid the difficulty of the occurrence of an appreciable varactor effect produced by a substantially intrinsic semiconductor layer which contains substantially no impurities, it is desirable that the impurity concentration of the surface layer will be reduced to some extent only, but not to zero.

Silicon oxide has precisely the "getter" properties which are of particular importance with certain impurities which properties may be due to large differences in the segregation constants of these impurities in silicon oxide and in silicon. In semiconductor technology these properties may be used to obtain a wafer having a surface layer containing few impurities. The method used for this purpose consists in oxidizing a surface film of the wafer during which process the oxide film formed absorbs impurities. Subsequently the oxide film is removed by etching. The impoverished layer underlying this oxide film is the layer which after removal of the oxide film forms the surface layer of the wafer. It should be noted that the processes by which the impurity concentrations of the surface layer of the wafer are reduced are completely different for phosphorus and for boron, although the treatments are similar.

Figure 4:
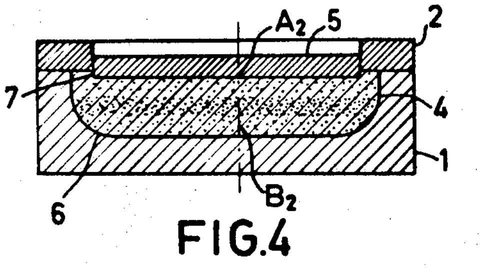
Figure 4A:
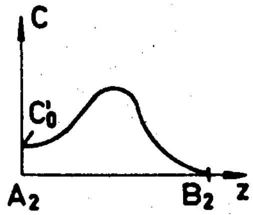

Thus the weakly doped layer is obtained by providing an oxide film on the silicon surface, which film absorbs a large part of the impurity of the underlying layer, which is thus purified. FIGURE 4 shows this oxide film 5 which serves as a getter. The distribution of the impurity concentration in the doped zone 4 is symbolized by the varying density of the dots in this zone and by the curve of FIGURE *4a* which similarly to FIGURE 3 is a graph representing the impurity distribution between points $A_2$ and $B_2$ of FIGURE 4.

Figure 5:
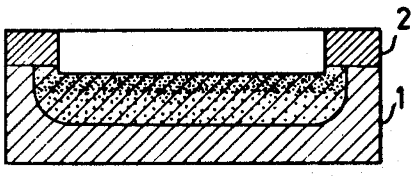
Figure 6:
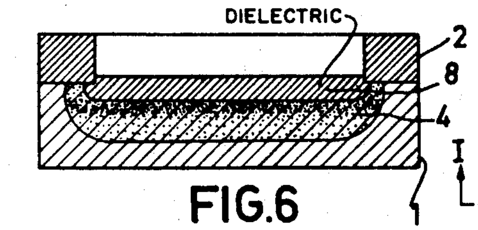

FIGURE 5 shows the wafer after removal of the oxide film 5 by etching and FIGURE 6 shows this wafer after the conversion of the weakly doped zone into a silicon oxide film 8.

Figure 7:
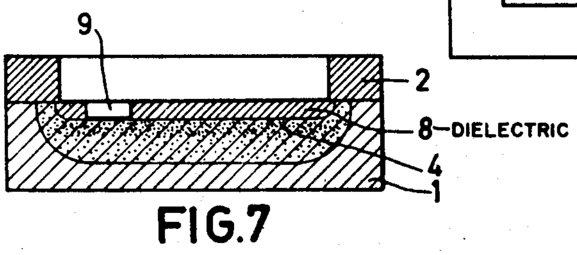

In this film a window 9 (FIGURE 7) is made, and subsequently the electrode 10 is applied to the oxide layer 8 and the contact 11 to the semiconductor electrode 4 is formed, for example, in one or more steps by evaporation (FIGURE 1).

The invention enables a planar capacitor to be obtained which comprises lightly doped silicon dioxide as the dielectric, an electrode consisting of a thin zone of silicon of high conductivity and an electrode consisting of a layer of metal, for example aluminum, formed by evaporation. This permits of manufacturing capacitors having a high mechanical strength owing to the strong adherence between the component parts.

Since by the method according to the invention microminiature capacitors are obtainable having connections on the same surface of the wafer, these capacitors are technically compatible with other elements of an electronic circuit so that they can be used in integrated circuits.

The above-described method in accordance with the invention in which phosphorus is used as the doping material has the further advantage that it can readily be combined with the manufacture of other elements of integrated circuits in which "planar" techniques are used.

An embodiment of a method of manufacturing a capacitor will now be described by way of example. The starting material is a silicon wafer 1 having a comparatively high resistivity (0.5 Ωcm.) or a wafer built up from layers, the upper layer being comparatively thick (at least about 20μ; this wafer is polished in known manner and then coated with an oxide layer 2. By photoetching, a window 3 shaped in the form of the lower electrode is made in the oxide layer and through this window phosphorus is diffused in high concentration to a comparatively shallow depth (10μ. Thus, a layer 4 of a high conductivity is formed at the surface of the semiconductor to act as an electrode.

During this diffusion at the surface of the wafer an oxide film is produced, which subsequently is removed in known manner by means of hydrofluoric acid.

By thermal oxidation an oxide film of a thickness from 4 to 5μ which is to serve as a getter is then produced at the surface. During this process the doping impurity penetrates to a greater depth.

After removal of the oxide film 5 by etching with hydrofluoric acid, the silicon wafer has a polished surface under which the first silicon layer is lightly doped. It should be noted that the excellent polishing produced by etching $SiO_2$ with hydrofluoric acid is an additional advantage of this method.

Subsequently this lightly doped layer is thermally oxidized in an atmosphere of dry oxygen so that a thin oxide film 8 having a thickness of a few hundred A. is produced which forms the dielectric of the capacitor. By a photographic etching process a window 9 is made in this oxide film 8 for making a contact to the first electrode, an aluminum layer having a thickness of from 0.4 to 0.8μ being applied by evaporation to two different zones 10 and 11 the shapes and dimensions of which are determined by masking. At 11 the aluminum deposit forms the contact to the electrode 4; at 10 the aluminum deposit forms the other electrode to which a connection may be made.

Interconnections to other elements of the circuits may be established entirely or in part by evaporation of metal layers, possibly during the same operation, or in another manner, for example, by thermocompression bonding.

Thus, capacitors can be manufactured in which the dielectric has a thickness of 300 A.; their capacitance values may be 1000 pf. per square mm. and they can be incorporated in integrated circuits.

Obviously the above described embodiments may be modified without departing from the scope of the invention.

What is claimed is:

1. A metal-oxide-semiconductor capacitor for incorporation in a semiconductor wafer, comprising a layer of semiconductive material in said wafer having a relatively high conductivity-modifying impurity concentration, said layer constituting a first electrode of said capacitor, a dielectric layer overlying said first electrode layer and having an opening therein exposing a terminal area on the surface of said first electrode, the dielectric layer being a genetic compound of a layer in said wafer having a relatively low conductivity-modifying impurity concentration, a metallic electrode on the surface of the dielectric layer leaving exposed the opening in the dielectric layer, said metallic electrode constituting a second electrode of said capacitor, and a conductive connection disposed in said opening and attached to said terminal area and electrically insulated from the second electrode.

2. A metal-oxide-semiconductor capacitor as set forth in claim 1 wherein the semiconductive layers are of silicon, and the genetic compound is silicon oxide.

3. A metal-oxide-semiconductor capacitor as set forth in claim 2 wherein the conductivity-modifying impurity is phosphorus or boron.

4. A metal-oxide-semiconductor capacitor as set forth in claim 3 wherein the second electrode and the conductive connection are both of aluminum.

5. A metal-oxide-semiconductor capacitor as set forth in claim 1 wherein the wafer is of silicon having a relatively low conductivity-modifying impurity concentration, the first electrode layer is of silicon, the surface of the first electrode layer is below the surface of the wafer, the dielectric layer is of silicon oxide, a silicon oxide layer is on the wafer surface and connects to the dielectric layer, and the concentration of the impurity in the first electrode layer decreases in a direction into the wafer.

References Cited

UNITED STATES PATENTS

| | | | |
|---|---|---|---|
| 3,097,308 | 7/1963 | Wallmark | 307—88.5 |
| 3,202,891 | 8/1965 | Frankl | 317—258 |
| 3,274,025 | 9/1966 | Ostis | 117—217 |

JAMES D. KALLAM, *Primary Examiner.*